US007759642B2

(12) United States Patent
Nir

(10) Patent No.: US 7,759,642 B2
(45) Date of Patent: Jul. 20, 2010

(54) PATTERN INVARIANT FOCUSING OF A CHARGED PARTICLE BEAM

(75) Inventor: Zvi Nir, Karmei Yosef (IL)

(73) Assignee: Applied Materials Israel, Ltd., Rehovot (IL)

( * ) Notice: Subject to any disclaimer, the term of this patent is extended or adjusted under 35 U.S.C. 154(b) by 251 days.

(21) Appl. No.: 12/112,913

(22) Filed: Apr. 30, 2008

(65) Prior Publication Data

US 2009/0272900 A1 Nov. 5, 2009

(51) Int. Cl.
*H01J 37/21* (2006.01)
(52) U.S. Cl. .................. 250/310; 250/307; 250/309
(58) Field of Classification Search ............ 250/307, 250/310, 309
See application file for complete search history.

(56) References Cited

U.S. PATENT DOCUMENTS 3,829,691 A * 8/1974 Hufnagel ............... 250/310
5,512,747 A * 4/1996 Maeda ................... 250/310
6,521,891 B1 * 2/2003 Dotan et al. ............ 250/310
6,852,973 B2 * 2/2005 Suzuki et al. ........... 250/306
7,425,704 B2 * 9/2008 Miyai et al. ............ 250/310
7,598,490 B2 * 10/2009 Kurihara et al. ........ 250/307

\* cited by examiner

*Primary Examiner*—Jack I Berman
(74) *Attorney, Agent, or Firm*—Sonnenschein, Nath & Rosenthal LLP

(57) ABSTRACT

A method for focusing a scanning microscope, including scanning a primary charged particle beam across first sites of a reference die of a wafer, detecting a secondary beam emitted from the sites, and computing first focus scores for the sites based on the secondary beam. The method includes scanning the primary beam across second sites of a given die of the wafer while modulating a focal depth of the primary beam, the reference die and the given die having congruent layouts, the second sites corresponding vectorially in location with the first sites, and detecting the secondary beam emitted from the second sites in response to the primary beam. The method also includes computing second focus scores for the second sites based on the detected secondary beam emitted therefrom, and determining an exact focus of the primary beam for the second sites using the first and the second focus scores.

18 Claims, 14 Drawing Sheets

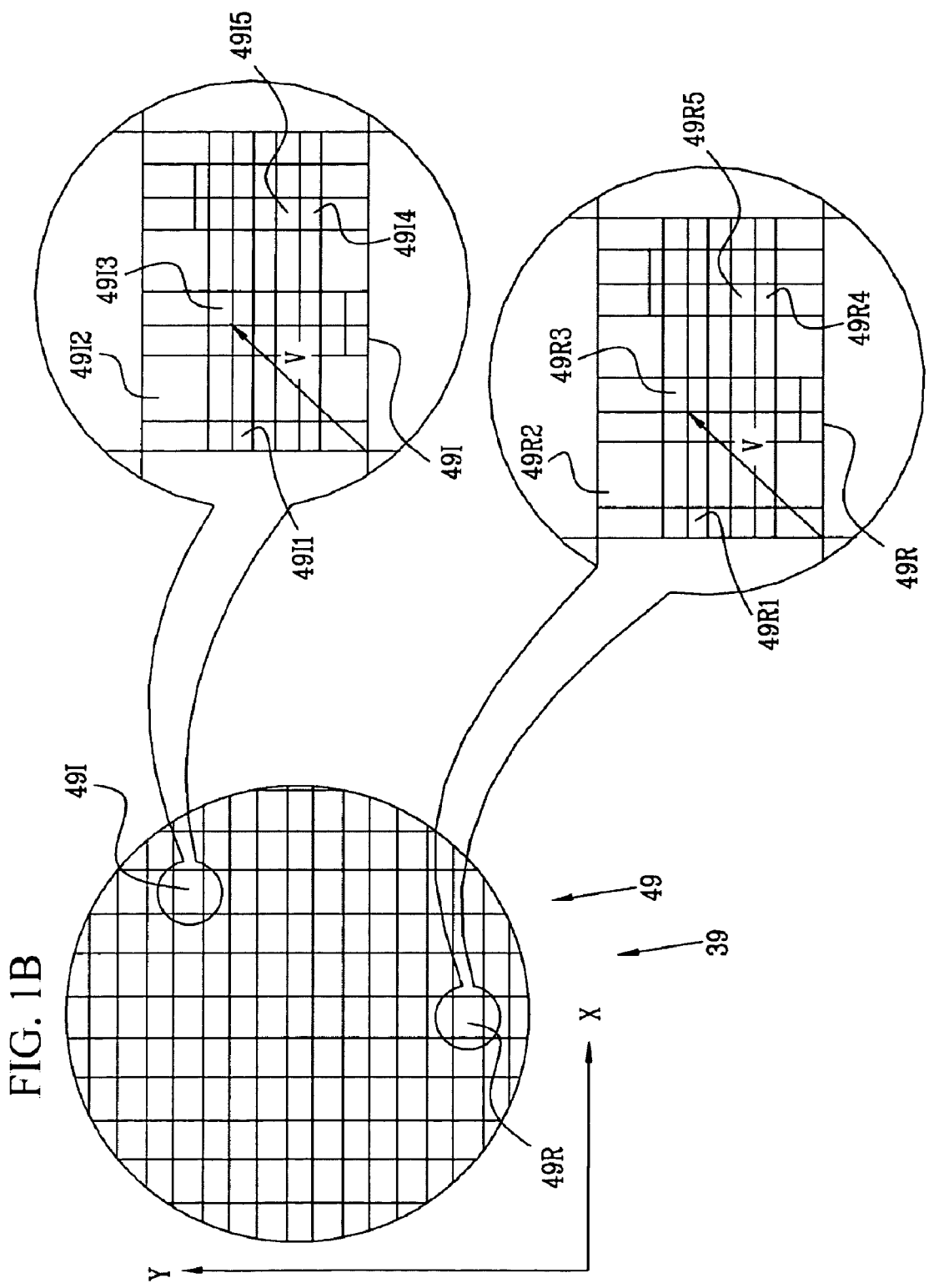

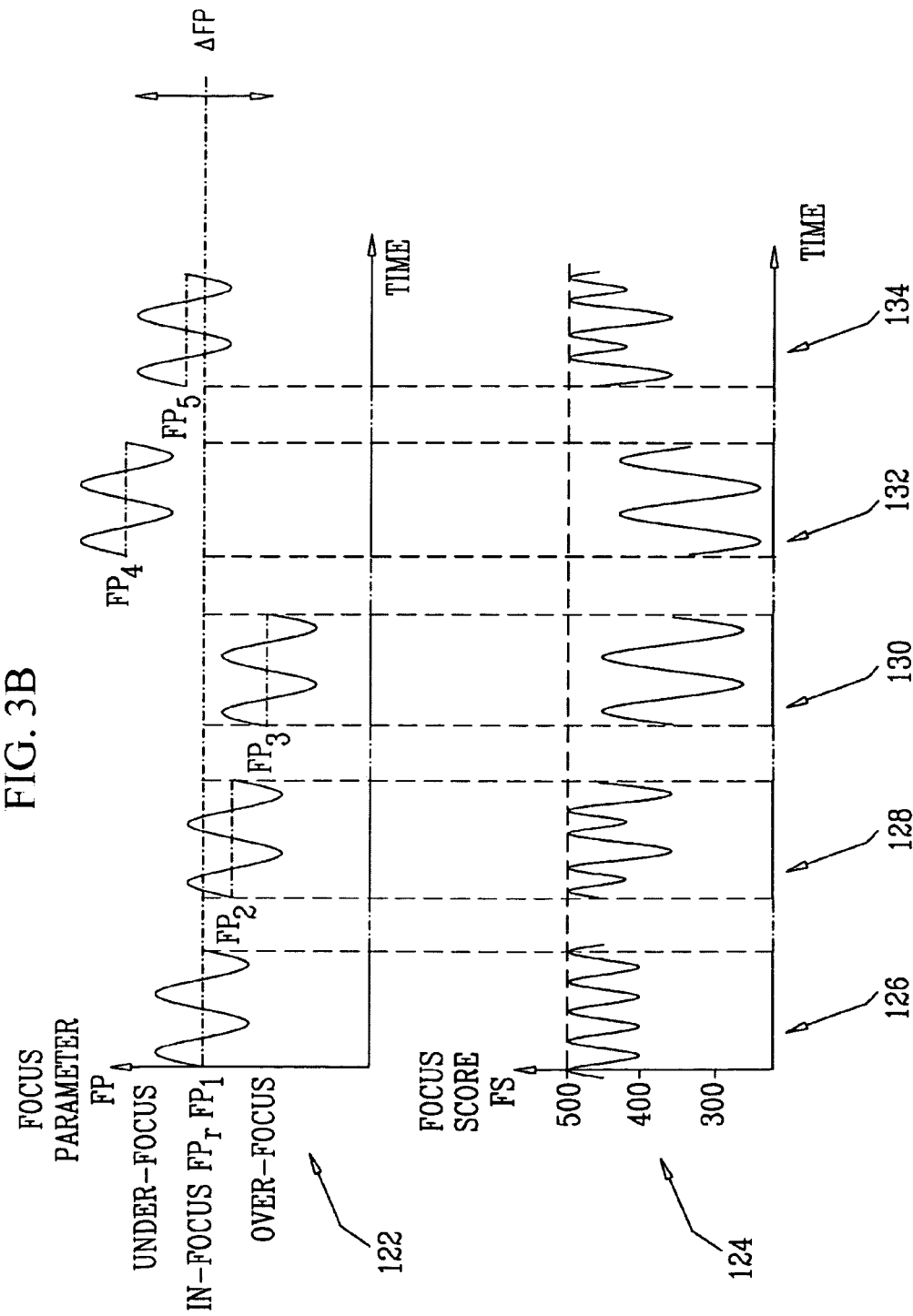

FIG. 9
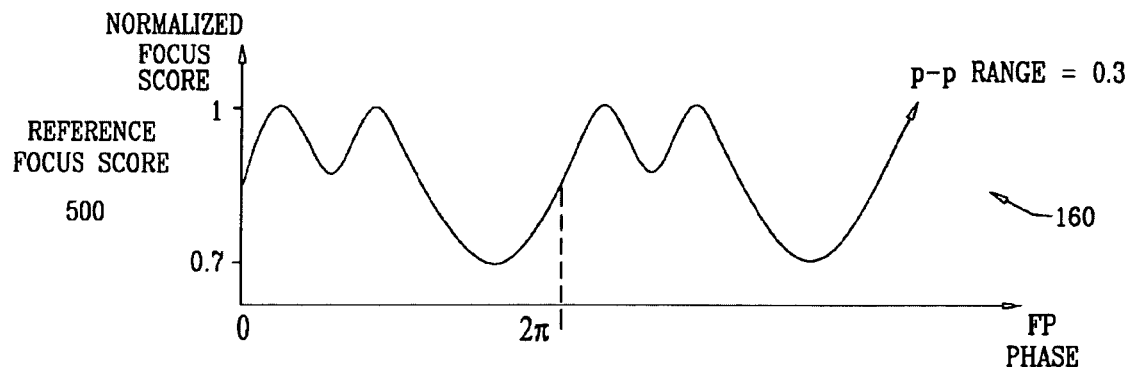
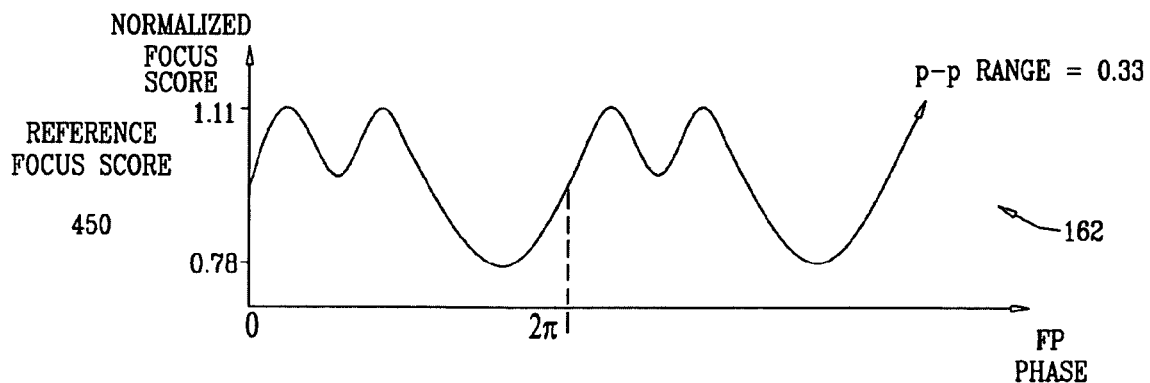
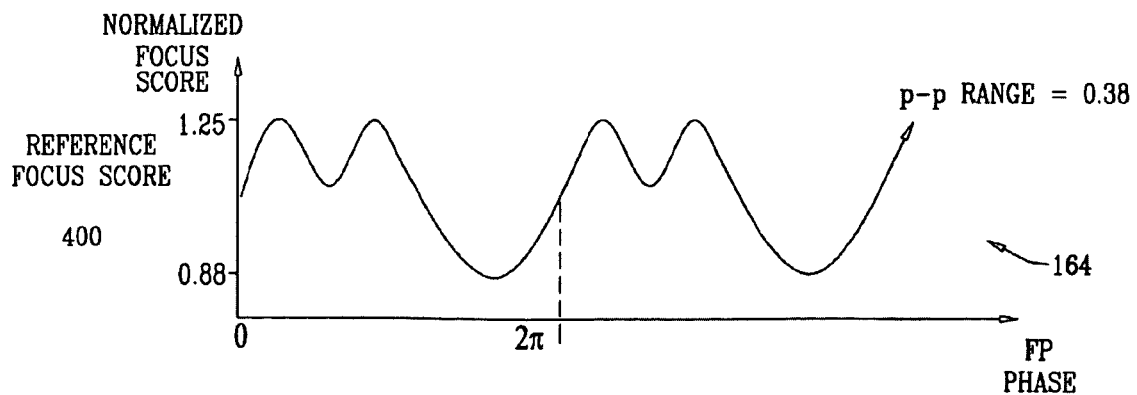

PATTERN INVARIANT FOCUSING OF A CHARGED PARTICLE BEAM

FIELD OF THE INVENTION

The present invention relates generally to focusing systems, and specifically to focusing charged particle beams.

BACKGROUND

Charged particle beams, such as those that are used in focused ion beam or scanning electron microscopes, are typically focused by scanning the beam over a sample with sharp edges.

Other methods for focusing electron beams are known in the art. For example, U.S. Pat. No. 5,483,036, to Giedt, et al., whose disclosure is incorporated herein by reference, describes a method for automatically focusing an electron beam by determining the beam size. The beam is swept over a number of narrow slits, and the current profiles generated as the beam sweeps are used to find the beam size, and to focus the beam to an optimal position.

U.S. Pat. No. 5,726,919, to Azad, et al., whose disclosure is incorporated herein by reference, describes a system for measuring the effective focus of an electron beam. The electron beam generates a temperature profile of an irradiated target, and the temperature profile is measured optically. Beam focus operating parameters are varied until an error between the measured temperature profile and a predicted profile for an effective focus are less than a predetermined value.

U.S. Pat. No. 6,621,082, to Morita, et al., whose disclosure is incorporated herein by reference, describes an automatic focusing system for a scanning electron microscope. The system uses focal positions from an optical microscope and the electron microscope to automatically adjust the focus of the electron microscope.

U.S. Pat. No. 5,614,713, to Kobaru, et al., whose disclosure is incorporated herein by reference, describes a scanning electron microscope wherein a focusing correction signal is produced using a light beam.

U.S. Pat. No. 5,130,540, to Yamada, et al., whose disclosure is incorporated herein by reference, describes a method for automatic focusing of an electron microscope using an auxiliary, coil that is close to the objective lens of the microscope.

U.S. Pat. No. 5,032,725, to Kanda, whose disclosure is incorporated herein by reference, describes a method for focusing a beam of an electron microscope. The disclosure states that an output signal is investigated for one magnification or scanning time of the beam over a range of foci to determine the optimum output value for that one magnification. The disclosure also states that the investigation may be repeated for other magnifications to generate a series of optimum output values, and that the microscope may then be operated at the focus corresponding to the optimum of the series of optimum values.

U.S. Pat. No. 4,933,553, to Tomizawa, et al., whose disclosure is incorporated herein by reference, describes focusing an electron beam of an electron microscope. An optimum exciting current for a focusing lens is determined by measuring a centroid of an area generated by the microscope.

U.S. Patent Application 2006/0049364, to Sender, whose disclosure is incorporated herein by reference, describes a method and system for focusing a charged particle beam.

SUMMARY OF THE INVENTION

In an embodiment of the present invention, a multiplicity of substantially similar dies on the surface of a wafer are inspected. Each die has a plurality of sites, such as a group of memory elements, in respective corresponding locations. In order to inspect the dies a processor of a scanning microscope scans a primary charged particle beam across the wafer, typically in a raster pattern. A focal parameter applied to a focusing element of the microscope controls the focus depth of the beam. The primary charged particle beam causes a secondary beam of charged particles to be emitted from the dies, and one of the dies is used as a reference die. While the reference die is scanned with the primary charged particle beam, the focal parameter is maintained substantially fixed, and the processor determines a focus score for each of the sites of the reference die from the secondary beam. The focus score typically measures sharpness of a patterned feature at the sites.

The processor scans remaining dies of the wafer by modulating the focal parameter about a mean value, so that the secondary beam has a modulated characteristic due to the modulation of the primary beam. The processor evaluates the secondary beam to determine a focus score, which varies with the modulation of the secondary beam, for each of the sites of the remaining dies. The processor normalizes the focus scores of a given site of each of these dies using the focus score of the corresponding site of the reference die. The processor uses the normalized focus scores to determine a value of the focal parameter that gives an exact focus for the primary, charged beam, and corrects the mean value of the focusing parameter accordingly. By normalizing the focus scores, embodiments of the present invention are able to achieve significantly faster focusing of sites having different characteristics, typically different patterns, compared to systems which do not use a reference focal score for normalization.

The processor may measure a phase difference between the modulated focal parameter and the varying normalized focal scores, and use the phase difference to determine the correction to be applied to the mean value of the focal parameter to achieve exact focus. Alternatively or additionally, the processor may measure an amplitude variation of the normalized focus scores, and use the amplitude variation to determine the correction to be applied.

The present invention will be more fully understood from the following detailed description of the embodiments thereof, taken together with the drawings, a brief description of which follows.

BRIEF DESCRIPTION OF THE DRAWINGS

FIG. 1B is a schematic diagram of a wafer irradiated by the system of FIG. 1A, according to an embodiment of the present invention;

FIGS. 3A and 3B show graphs derived in scanning a wafer, according to an embodiment of the present invention;

FIG. 9 shows theoretical graphs of normalized focus scores derived in scanning a wafer, according to an embodiment of the present invention;

DETAILED DESCRIPTION

Figure 1A:
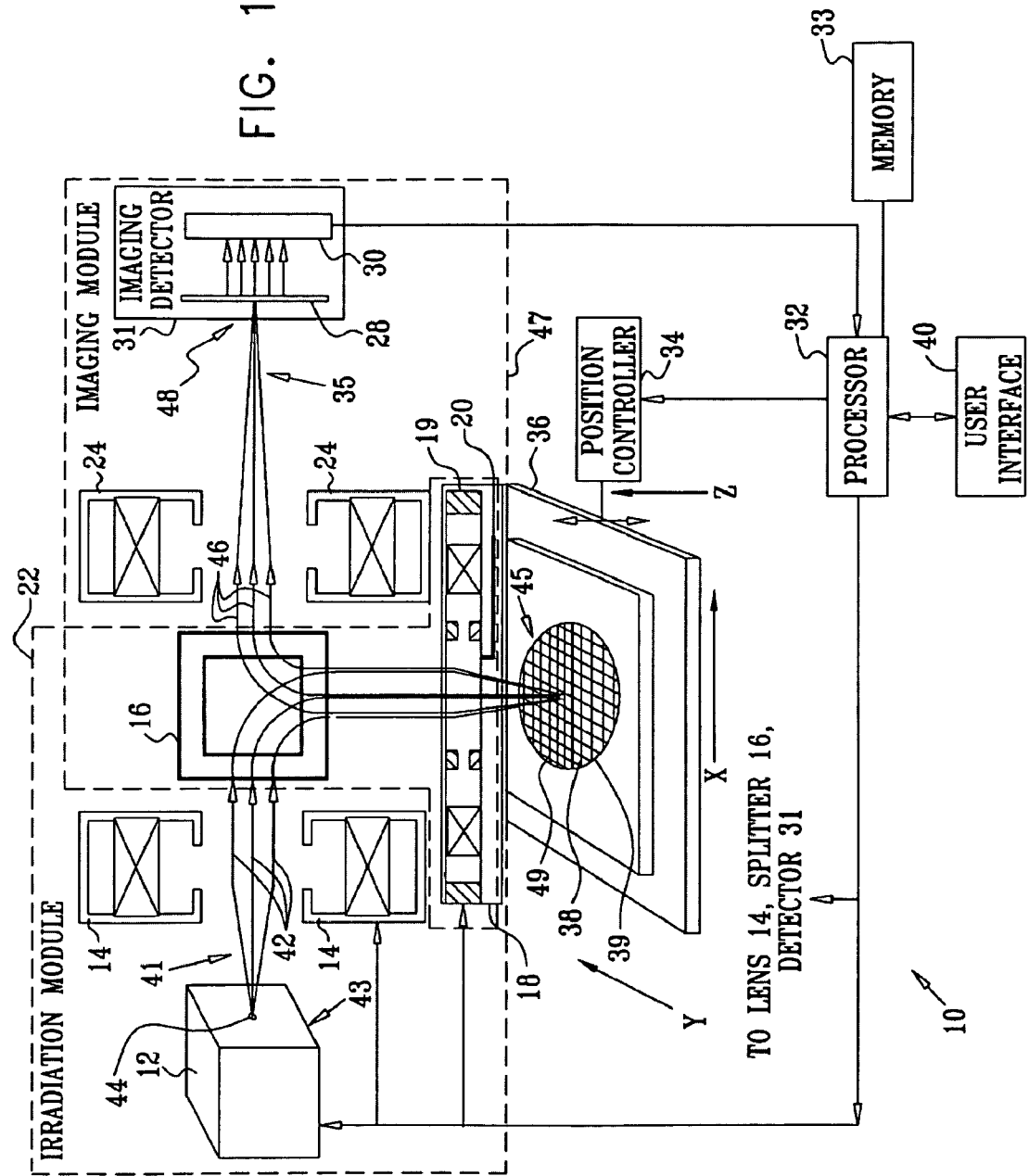
FIG. 1A is a schematic diagram of a charged particle beam focusing system, according to an embodiment of the present invention.

Reference is now made to FIG. 1A, which is a schematic diagram of a charged particle beam focusing system 10, and to FIG. 1B, which is a schematic diagram of a wafer irradiated by system 10, according to an embodiment of the present invention. System 10 includes a charged particle beam irradiation module 22, which, by way of example, is assumed to generate a single primary charged particle beam 41 from an aperture 44 of a charged particle gun 12. It will be appreciated, however, that the scope of the present invention is not limited to generation of a single charged particle beam, so that module 22 may be configured to generate multiple beams.

Furthermore, the scope of the present invention is not limited to focusing a particular type of charged particle, and includes substantially all types of charged particles, including electrons and ions such as Gallium or other metallic ions. By way of example, the description hereinbelow assumes that the primary charged particle beam comprises electrons.

Module 22 comprises one or more illumination lenses 14, a beam splitter 16, and an objective lens 18, the lenses acting as focusing elements. Typically, the one or more lenses 14 and beam splitter 16 operate magnetically, although the lenses and/or the beam splitter may also incorporate other types of operation, such as electrostatic operation. By way of example, lenses 14 are herein assumed to comprise an octopole. Objective lens 18 may advantageously be a retarding lens, comprised of a magnetic portion 19 and an electrostatic portion 20.

Beam 41 follows an irradiation path 42 through module 22 to a surface 38 of a wafer 39. FIG. 1B illustrates the surface of wafer 39 in more detail. Wafer 39 is mounted on a movable stage 36, which is assumed to be able to translate the wafer parallel to three orthogonal axes x, y, and z. The one or more lenses 14, beam splitter 16, and objective lens 18 form beam 41 into a focused image 45, hereinbelow also referred to as a spot 45, of aperture 44 on surface 38. As illustrated in FIG. 1B, wafer 39 comprises a multiplicity of substantially similar dies 49, the dies having substantially congruent layouts. The dies are herein assumed to be rectangular dies having sides parallel to the x and y axes.

In the following description, dies 49 are differentiated, as appropriate, by assigning a suffix letter after the identifying number 49. Within each die there are a number of different sections or sites, such as a memory site or a logic gate site. Typically, within any given site there is a repeating pattern of elements, such as conductive lines, but the pattern changes from site to site. Herein, sites of a die are distinguished by assigning a suffix number to the die identifier, and, by way of illustration in FIG. 1B sites of dies are shown as differently sized rectangles. In practice, it will be understood that a site mat, comprise substantially any two-dimensional figure.

By ways of example, wafer 39 is assumed to comprise a reference die 49R, which, as described below, has sites 49R1, 49R2, 49R3, 49R4, and 49R5. Also, wafer 39 comprises a given inspected die 49I, which has sites 49I1, 49I2, 49I3, 49I4, and 49I5 that respectively correspond vectorially in location with sites 49R1, 49R2, 49R3, 49R4, and 49R5 of the reference die. Thus, a vector V defining a location of site 49R3 measured relative to a local origin of die 49R also defines a location of site 49I3 measured relative to a local origin of die 49I.

Spot 45 generates reflected, secondary, and/or back-scattered electrons as a secondary charged particle beam 35 of electrons, which passes through objective lens 18, and beam splitter 16. The secondary beam from spot 45 follows an imaging path 46, via an imaging lens 24 to an electron detector 28. Electron detector 28, typically a phosphor screen comprised of a scintillator crystal or a granulated scintillator powder, converts secondary beam 35 of electrons to optical radiation, which is imaged by an imager 30, such as a charge coupled detector (CCD) array. Detector 28 and imager 30 are typically combined as one unit, and act as an imaging detector 31 of the secondary beam. Alternatively, imaging detector 31 may comprise an avalanche photodiode array, which directly detects secondary beam 35 without conversion to light. Lenses 18 and 24, beam splitter 16, and imaging detector 3J comprise an imaging module 47 for system 10. The image generated by imaging module 47 is transferred to a processor 32 coupled to a memory 33. The processor analyzes the image and, as described in more detail below, the processor adjusts the focus of spot 45 to be at an exact focus, i.e. in-focus, in response to the analysis.

Processor 32 is coupled to gun 12, lenses 14, beam splitter 16, objective lens 18, imaging lens 24, and imaging detector 31, so as to control their operation and the focus of spot 45, and also so as to act as an overall controller of system 10. For example, in order to adjust the focus of spot 45, processor 32 may adjust the excitation of magnetic portion 19 of lens 18, and/or the energy of the beam output from module 22, and/or parameters of lenses 14. Hereinbelow, by way of example, it is assumed that the focusing of spot 45 is implemented by adjusting a parameter, herein also termed a focusing parameter FP, of lenses 14. As is shown in more detail with respect to FIG. 2 below, adjusting FP adjusts a focal depth, i.e., the position of focus, of beam 41.

Typically, processor 32 scans spot 45 in an x direction and in a raster manner across dies 49, while the processor also moves the wafer in the y direction, by translating stage 36. Hereinbelow it is assumed that processor 32 receives operating parameters from an operator of the system via a user interface 40, which enables the operator to adjust settings of the system components described above, as well as other components of system 10 described below. Processor 32 is also coupled to, and operates, a position controller 34. Under command of the processor, controller 34 is able to adjust stage 36 in a vertical direction.

Figure 2:
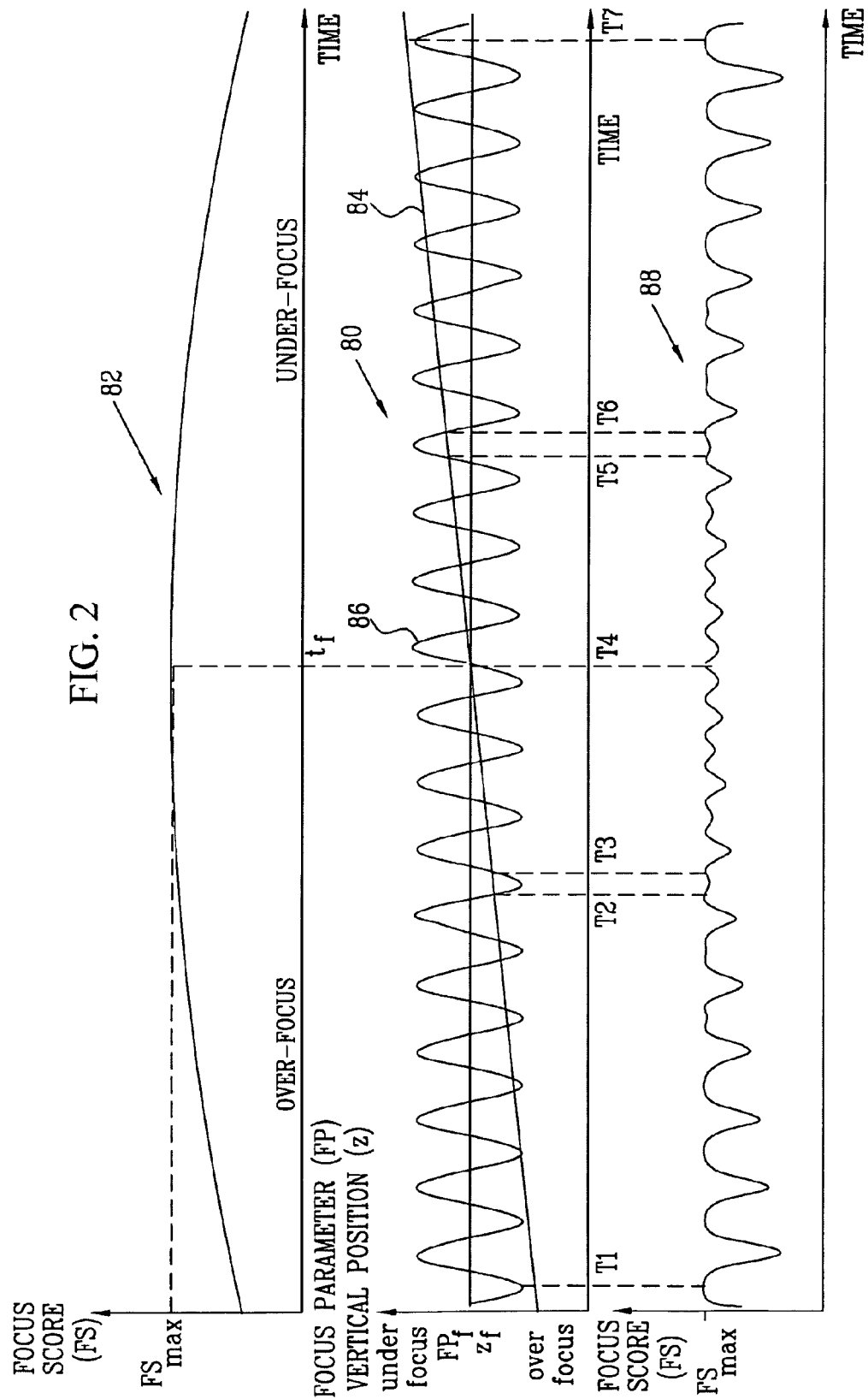
FIG. 2 shows graphs illustrating principles of operation of the system of FIG. 1A, according to an embodiment of the present invention.

FIG. 2 shows graphs illustrating principles of operation of system 10, according to an embodiment of the present invention. Graphs 80 and 82 are assumed to be derived as a section of wafer 39 passes from an over-focused state, through a focused state, to an under-focused state. The change through the focused state may be implemented by altering the effective focus depth of beam 41, such as by altering the value of FP, and/or by altering the vertical position of wafer 39. In the explanation herein for graphs 80 and 82, by wax, of example the change of focusing state is assumed to be by moving stage 36 vertically in time while the value of FP is maintained constant at $FP_f$, and a straight line 84 in graph 80 shows the vertical position (z) of the wafer vs. time. As the vertical position of the wafer changes, the focus of spot 45 on the wafer changes, and the spot is assumed to be in-focus, i.e., substantially exactly focused, when wafer surface 38 is at a vertical position $z_f$.

In order to determine focus, processor 32 determines a focus score FS, tropically in terms of sharpness of edge signals measured by detector 31 as spot 45 is scanned over surface 38. Graph 82 shows FS vs. time, and at time $t=t_f$, when spot 45 is in-focus, $z=z_f$ and $FP=FP_f$, and the value of FS is a maximum $FS_{max}$. Furthermore, consideration of graph 82 and graph 84 shows that there is a direct relationship between FP and FS, so that, for example, a given value of FP corresponds to one value of FS, and a given value of FS corresponds at most to two values of FP.

As described in more detail below, in inspecting dies other than the reference die in system 10 the value of the focusing parameter FP is modulated about a mean value, herein assumed to be $FP_f$. The modulation effectively varies the focus depth, or position of focus, of the electron beam. The modulated value of FP is shown by a graph 86, and the effect of the modulation on the focus score is shown in a graph 88. At times in the region of time T1, the value of the focus parameter is a minimum. At this time the value of FP approaches, but does not reach, the value necessary to set spot 45 into focus. Thus focus score FS passes through a local maximum at T1, the local maximum having a value less than $FS_{max}$.

At times in the region of times T2 and T3, the value of the focus parameter is close to a minimum. At times T2 and T3 the value of FP passes through the value necessary to set spot 45 into focus. Thus focus score FS passes through two local maxima, at T2 and T3, both having values of $FS_{max}$.

At times in the region of time T4, the value of the focus parameter varies symmetrically about the value necessary to set spot 45 into focus. Thus in addition to focus score FS passing through a local maxima at T4, local maxima of FS on either side of T4 have a value of $FS_{max}$ and are equidistant from the local maxima at T4.

The behavior of the focus score at times in the region of times T5 and T6, and at times in the region of time T1, is respectively generally similar to the behavior at times T2 and T3, and at time T1. Thus, at times T5, T6, the focus score has local maxima $FS_{max}$ and at time T7 the focus score has local maxima less than $FS_{max}$.

Figure 3A:
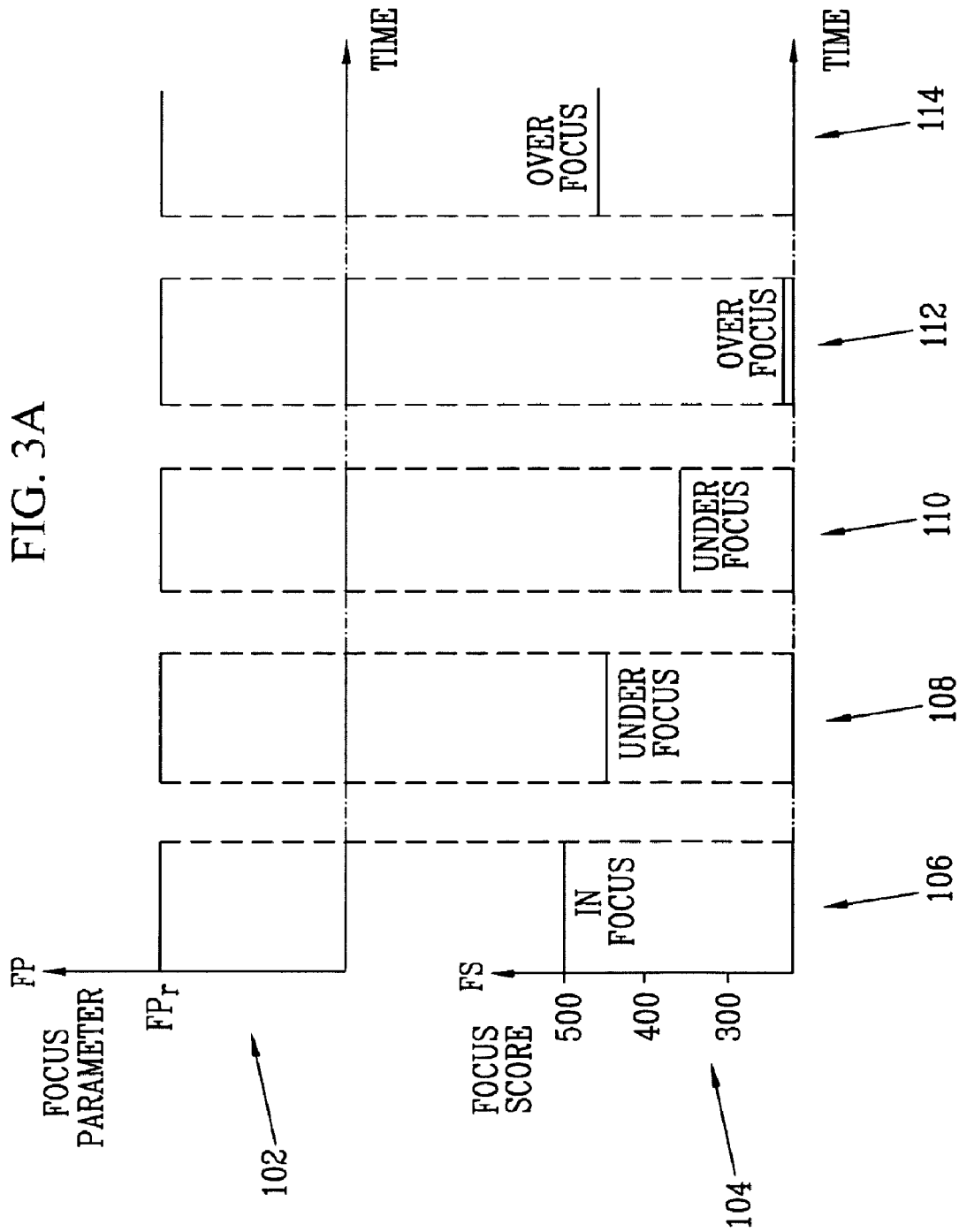

FIGS. 3A and 3B show graphs derived in scanning wafer 39, according to an embodiment of the present invention. In FIG. 3A a graph 102 and a graph 104 are schematic graphs for a scan of reference die 49R on wafer 39. Graph 102 is of the focusing parameter FP vs. time, and shows that processor 32 maintains the focusing parameter of lenses 14 of irradiation module 22 as substantially constant and unmodulated for the scan of the reference die. The value of the focusing parameter used for scanning the reference die is termed $FP_r$. Graph 104 is of the focus score FS vs. time and shows the focus scores for five exemplary sites 49R1, 49R2, 49R3, 49R4, and 49R5 of the reference die. In a first portion 106 of graph 102 and graph 104, the focus score is assumed to have its highest possible value 500, so that the site of the reference die being scanned, site 49R1, is in-focus. In second and third portions 108 and 110 of the graphs, the focus score is less than 500, being respectively 450 and 350, since the sites of the reference die being scanned, sites 49R2 and 49R3, are assumed to be underfocused. Site 49R3 is more out-of-focus than site 49R2.

In fourth and fifth portions 112 and 114 of the graphs, the focus scores are also less than 500, being respectively 325 and 475, since the sites of the reference die being scanned, sites 49R4 and 49R5, are assumed over-focused. Site 49R4 is more out-of-focus than site 49R5. It will be understood that the values of the focus scores indicate whether a site is in-focus or out-of-focus. If the site is out-of-focus, the value indicates by how much the site is out-of-focus. However, the focus score value does not indicate if an out-of-focus site is under-focused or over-focused. Typically, the changes between in-focus and out-of-focus states are characteristic of the structure or pattern of the site of the die being scanned, the pattern characteristics typically including concentrations and directions of line elements within a given site. The changes may also be a function of the relative vertical position of the sites. The inventors have found that embodiments of the present invention handle changes of structure or pattern, as well as changes of vertical position, extremely well.

In FIG. 3B a graph 122 and a graph 124 are schematic graphs of FP vs. time and FS vs. time for different theoretical scans of site 49I1 of inspected die 49I. Processor 32 scans inspected dies such as die 49I on the wafer by modulating the focusing parameter of irradiation module 22 around a value $FP_i$. In practice, system 10 alters the value of $FP_i$, as described below, to attempt to focus the site of the die being scanned by making FS as large as possible, and only one scan of a given site is normally performed. For purposes of explaining the operation of system 10, in the following description site 49I1, for which an optimal value of $FP_i$ is typically close to $FP_r$, five different values of $FP_i$, $FP_1$, $FP_2$, $FP_3$, $FP_4$, and $FP_5$ are used. By way of example the modulation of FP is assumed to be sinusoidal, and to have an approximately constant amplitude. In some embodiments, as explained below, processor 32 may vary the amplitude of the modulation. The modulation period is typically set to be of the order of thousands of raster scans of spot 45, although any other suitable modulation period may be used. In one embodiment, the modulation period is equal to approximately 5,000 raster scans, and a time constant for the alteration of $FP_i$ is set to be of the order of 20,000 raster scans.

Portions 126, 128, 130, 132, and 134 of graphs 122 and 124 are the focus parameters and focus scores for the five different values of $FP_i$. The portions of the graphs are explained further below.

Figure 4:
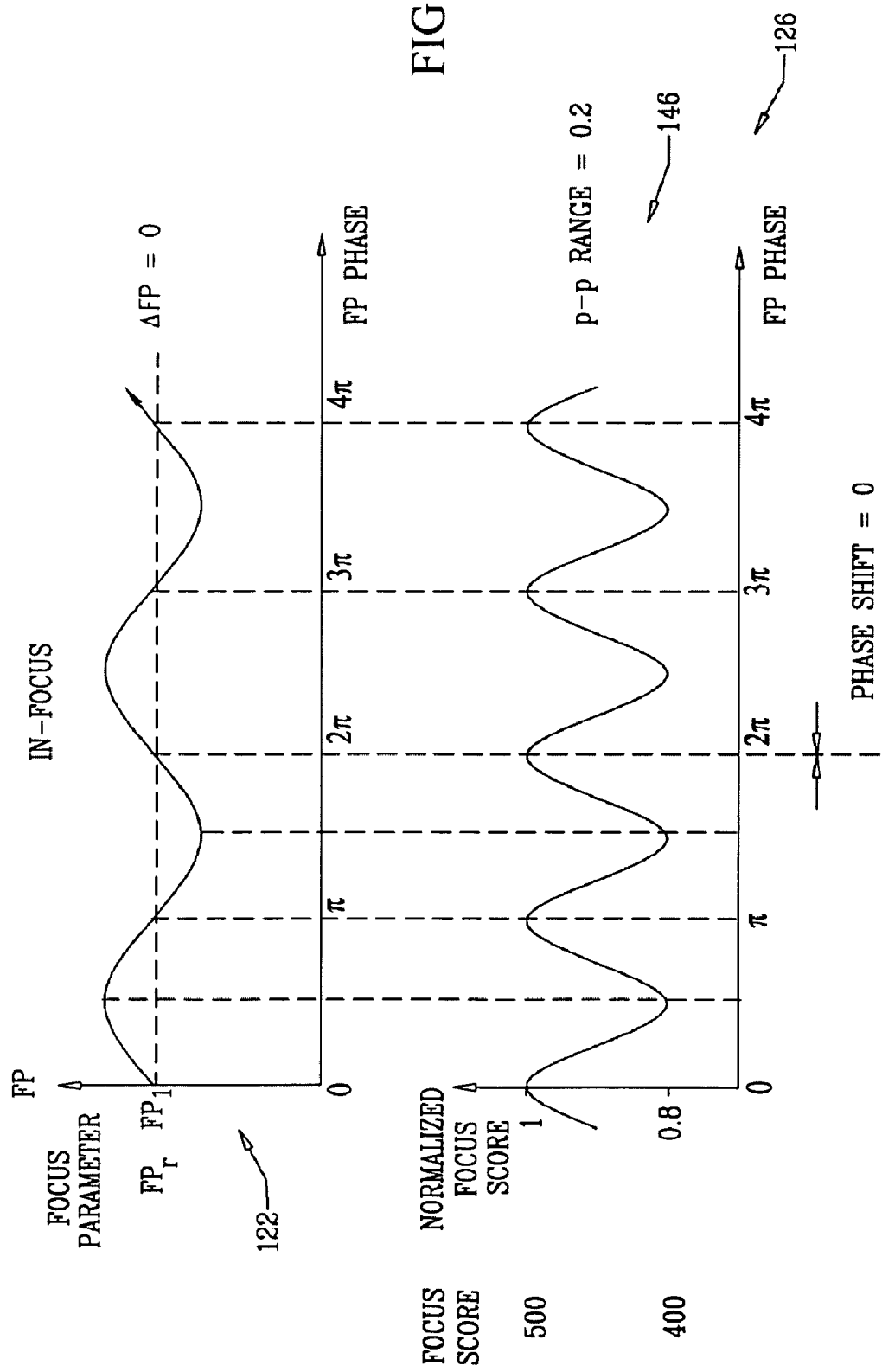
FIGS. 4-8 show portions of the graphs of FIG. 3B, and corresponding normalized graphs, according to an embodiment of the present invention.

FIG. 4 shows portion 126 of graph 122 and a graph 146 derived from graph 124, according to an embodiment of the present invention. Graph 146 shows on its ordinate the focus scores of graph 124 and corresponding normalized scores. The normalized scores are derived by dividing the focus scores of graph 124 by the focus score, 500, determined for the unmodulated scan of the reference site 49R1. The graphs are shown having a phase of FP as abscissa, rather than time as in FIGS. 3A and 3B. For portion 126 processor 32 is modulating the focus parameter about the value $FP_r$, which is equal to $FP_1$, so that $|(FP_r-FP_i)|$, herein written as ΔFP, equals 0. Graph 146 shows that the normalized focus score reaches a maximum whenever the focus parameter is at value $FP_r$. The minimum values of the normalized focus score are reached whenever the focus parameter is at its maximum value or minimum value.

As is seen from the graphs, the normalized focus scores have a maximum of 1, and the maxima occur at phases 0, π, 2π, . . . of FP. The normalized scores also have an amplitude variation, which is measured hereinbelow, by way of example, as a peak-peak range. The peak-peak (p-p) range of the normalized focus scores of graph 146 is 0.20. Inspection of graph 146 shows that, if the modulated focus parameter is assumed to have a value of $FP_r$ at phases 0, π, 2π, . . . , the normalized focus scores are maximum at these phases, and there is a separation of π between adjacent normalized focus score maxima. Furthermore, two maxima of the normalized focus score occur for each complete circle of the focus parameter, and the maxima of the normalized focus scores are in phase with phases 0, 2π, 4π, ... of focus parameter FP. Thus, using phase 2π of focus parameter FP as a reference, the maxima of the normalized focus scores have a zero phase shift.

Figure 5:
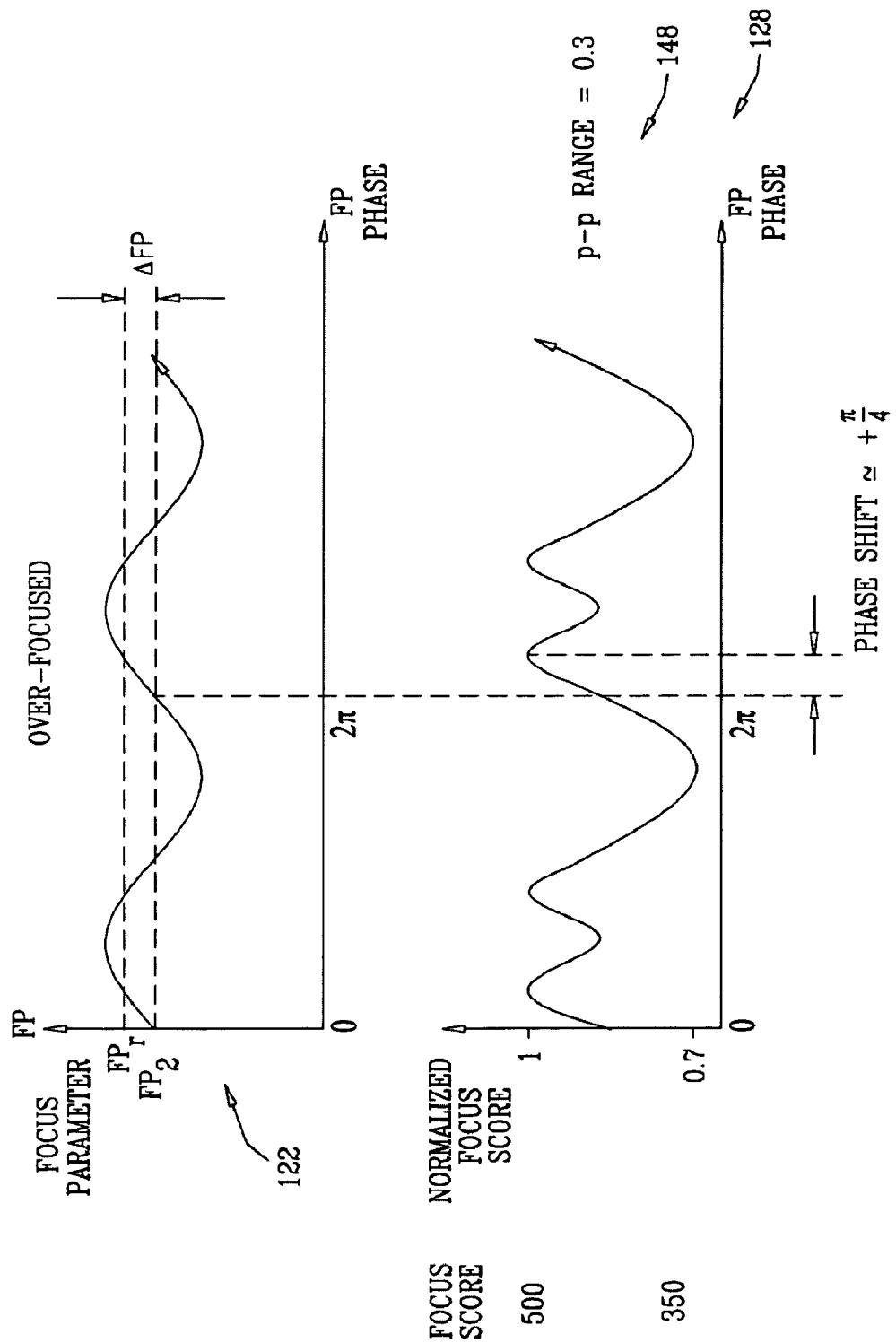

FIG. 5 shows portion 128 of graphs 122 and a graph 148 derived from graph 124, according to an embodiment of the present invention. $FP_2$ is less than $FP_r$, so that ΔFP>0. The modulation of the focus parameter about the value $FP_2$ causes site 49I1 to be in-focus at values of the focus parameter equal to $FP_r$, at which values the focus score reaches a maximum, as shown in graph 148.

Graph 148, of focus scores and normalized focus scores vs. phase, is derived generally as explained above for graph 146. As is seen from the graph, the normalized focus scores have a maximum of 1 and a minimum of 0.7. Two maxima of the normalized focus score occur for each complete cycle of the focus parameter. The graph also illustrates that the maxima are not equidistant from each other. Measured relative to FP reference phase 2π, the closest normalized focus score maximum has a phase shift of approximately $$+\frac{\pi}{4}.$$

The p-p range of the normalized scores is 0.3.

Figure 6:
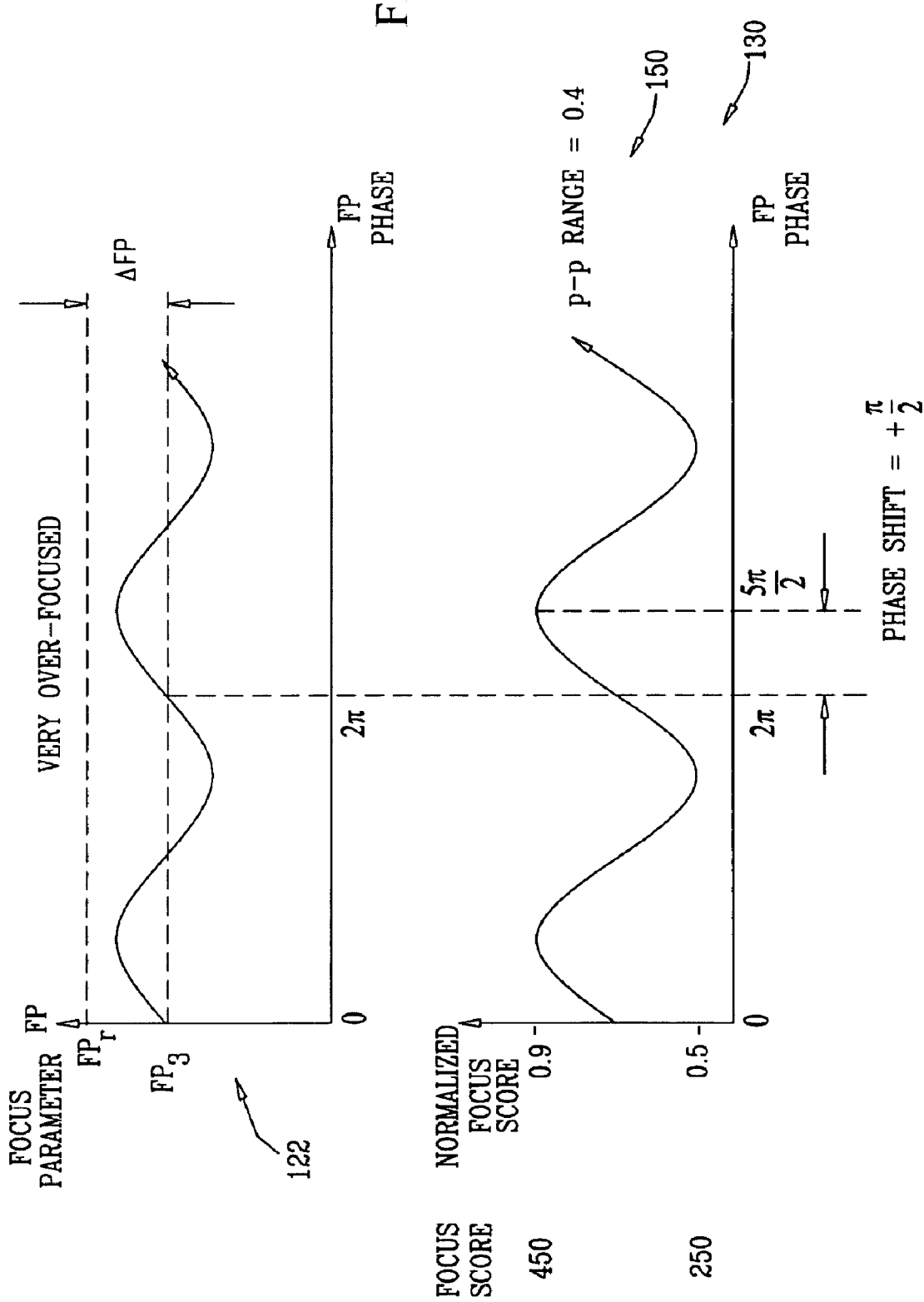

FIG. 6 shows portion 130 of graphs 122 and a graph 150 derived from graph 124, according to an embodiment of the present invention. Graph 150, of focus scores and normalized focus scores vs. phase, is derived generally as explained above for graph 146. $FP_3$ is significantly less than $FP_r$, so that ΔFP>>0. In contrast to graph 148, for graph 150 there is no value of the modulated focus parameter that brings site 49I1 into focus. The value of the focus parameter needed for the site to be in-focus is shown as level $FP_r$ in graph 122. As is shown in the graphs, the maximum value of the normalized focus score achieved is 0.9, and one maximum of the normalized focus score occurs for each complete cycle of the focus parameter. At the value 0.9 site 49I1 is closest to being in-focus. Measured relative to the FP reference phase 2π, the closest normalized focus score maximum has a phase shift of $$+\frac{\pi}{2}.$$

The p-p range of the normalized scores is 0.4.

Figure 7:
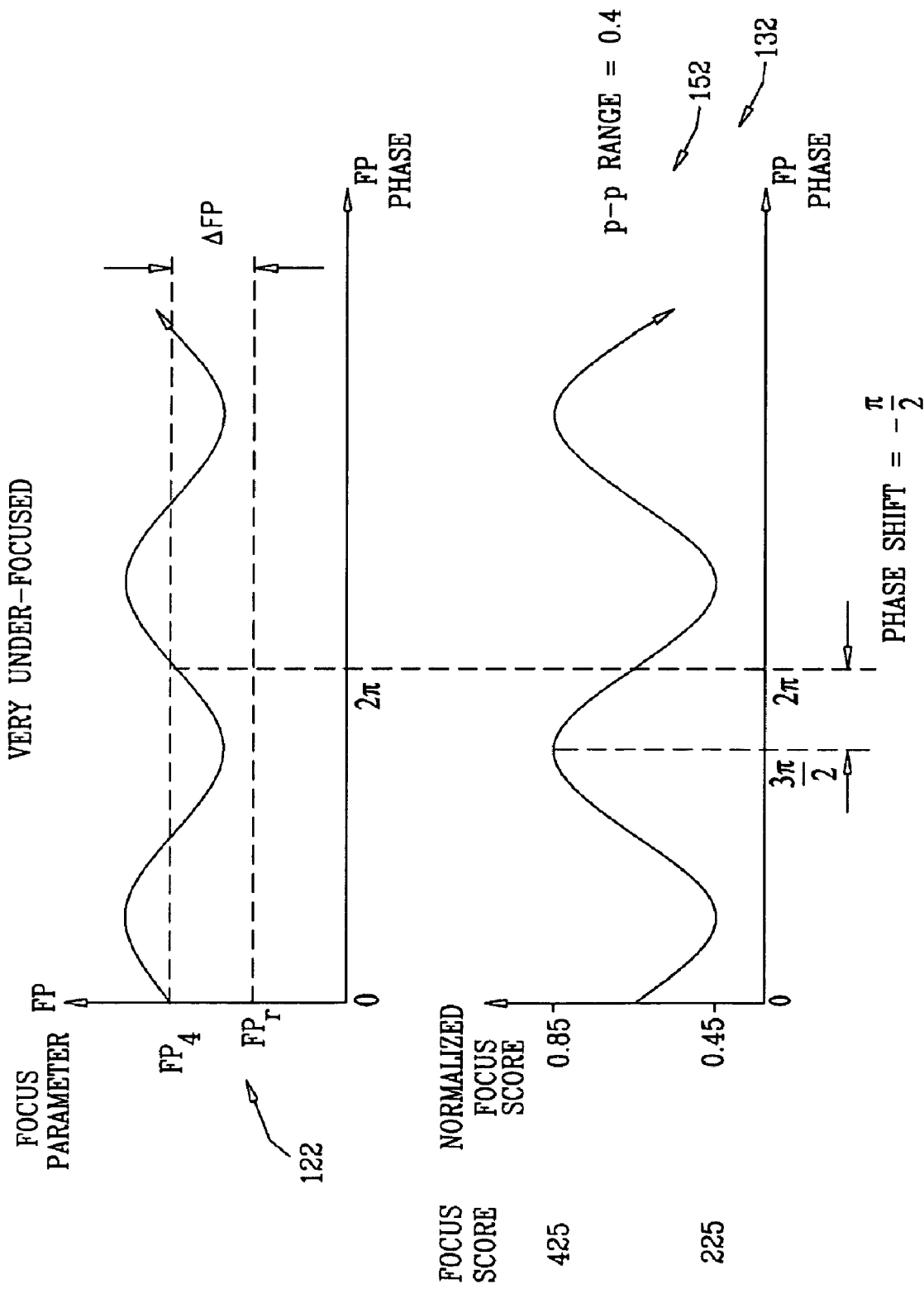

FIG. 7 shows portion 132 of graphs 122 and graph 152 derived from graph 124, according to an embodiment of the present invention. Graph 152, of focus scores and normalized focus scores vs. phase, is derived generally as explained above for graph 146. $FP_4$ is significantly greater than $FP_r$, so that ΔFP>>0. As for graph 150 (FIG. 6) there is no value of the modulated focus parameter that brings site 49I1 into focus, and there is one maximum of the normalized focus score for each complete cycle of the focus parameter. However, in contrast to graph 150, the closest normalized focus score maximum has a phase shift of $$-\frac{\pi}{2}.$$

measured relative to the FP reference phase 2π. The p-p range of the normalized scores is 0.4.

Figure 8:
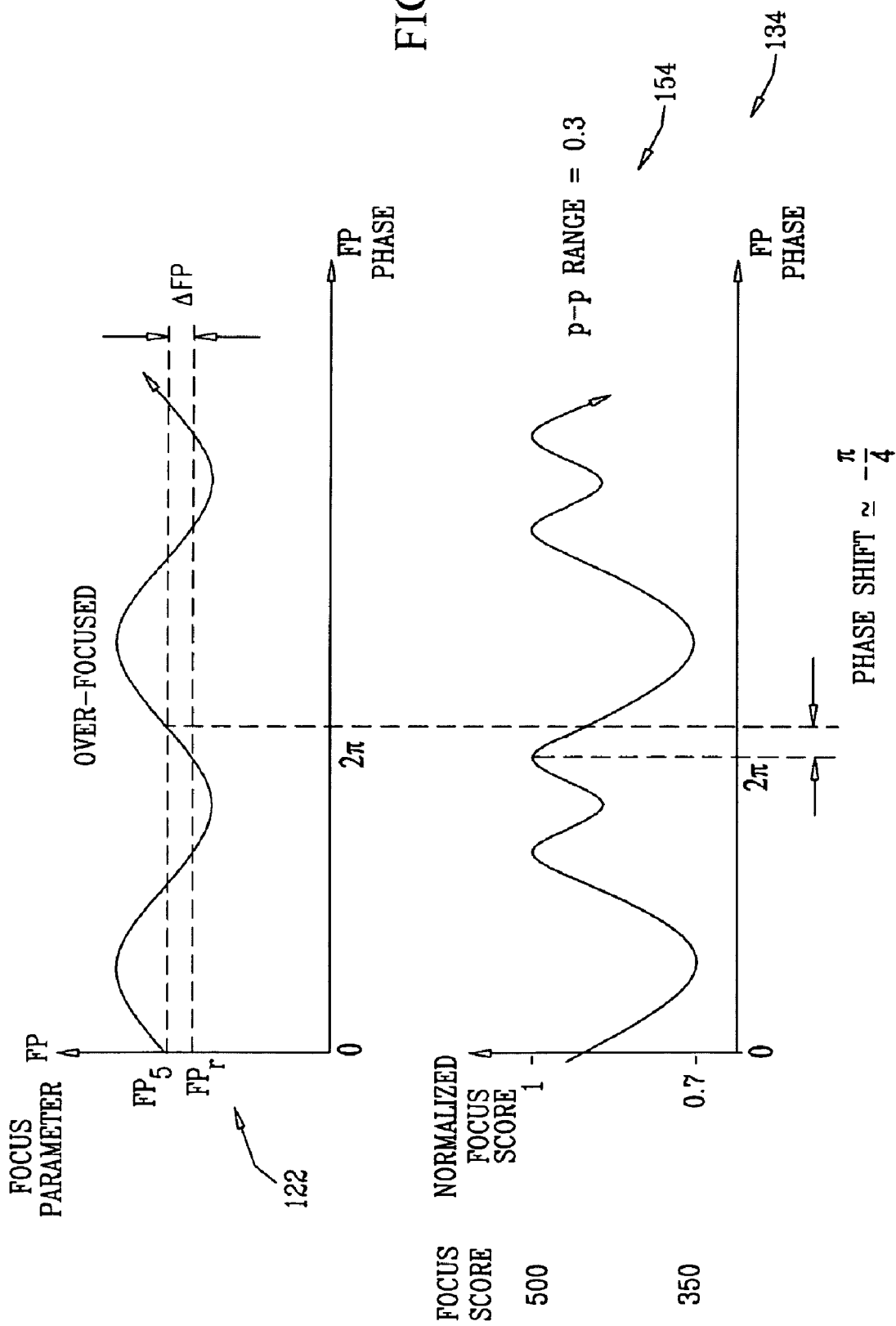

FIG. 8 shows portion 134 of graphs 122 and 124 and graph 154 derived from graph 124, according to an embodiment of the present invention. Graph 154, of focus scores and normalized focus scores vs. phase, is derived generally as explained above for graph 146. $FP_5$ is greater than $FP_r$, so that ΔFP>0. The modulation of the focus parameter about the value $FP_5$ causes site 49I1 to be in-focus at values of the focus parameter equal to $FP_r$, at which values the focus score reaches a maximum, as shown in graph 154.

As is seen from graph 154, the normalized focus scores have a maximum of 1 and a minimum of 0.7. Two maxima of the normalized focus score occur for each complete cycle of the focus parameter. The graph also illustrates that the maxima are not equidistant from each other. Measured relative to FP reference phase 2π, the closest normalized focus score maximum has a phase shift of approximately $$-\frac{\pi}{4},$$

and the p-p range of the normalized scores is 0.3.

FIGS. 4-8 illustrate normalized focus scores for a reference site having a focus score of 500. As is shown below with reference to FIG. 9, by normalizing the focus scores with respect to a reference site, which typically has a focus score less than 500, normalized maximum values increase, and p-p values of the normalized focus scores also increase. The enhanced values of the normalized maximum, and of the p-p values, both lead to processor 32 being able to achieve optimal focus significantly faster than systems that do not normalize the focus scores.

FIG. 9 shows theoretical graphs of normalized focus scores derived in scanning wafer 39, according to an embodiment of the present invention. The graphs assume that one reference site is scanned three times, giving a different focus score, 500, 450, and 400 each time. A corresponding inspected site is then scanned, giving a focus score graph generally similar to that of section 128 (FIG. 3B).

Graph 160, for the reference focus score of 500, repeats graph 148 (FIG. 5) and shows that the normalized focus score has a maximum of 1, a minimum of 0.7, and a p-p variation of 0.3. Graph 162 shows that for the reference focus score of 450, the maximum normalized focus score is 1.11, the minimum of 0.78, and the p-p variation is 0.33. Graph 164 shows that for the reference focus score of 400, the maximum normalized focus score is 1.25, the minimum is 0.88, and the p-p variation is 0.38. Thus, as the reference site becomes more out-of-focus, leading to a lower reference focus score, there is a corresponding increase in the normalized focus scores, as well as in the p-p variation of the normalized scores. The increase allows embodiments of the present invention to efficiently adjust for changes of focus, typically caused by changes in pattern, of inspected die sites.

Figure 10:
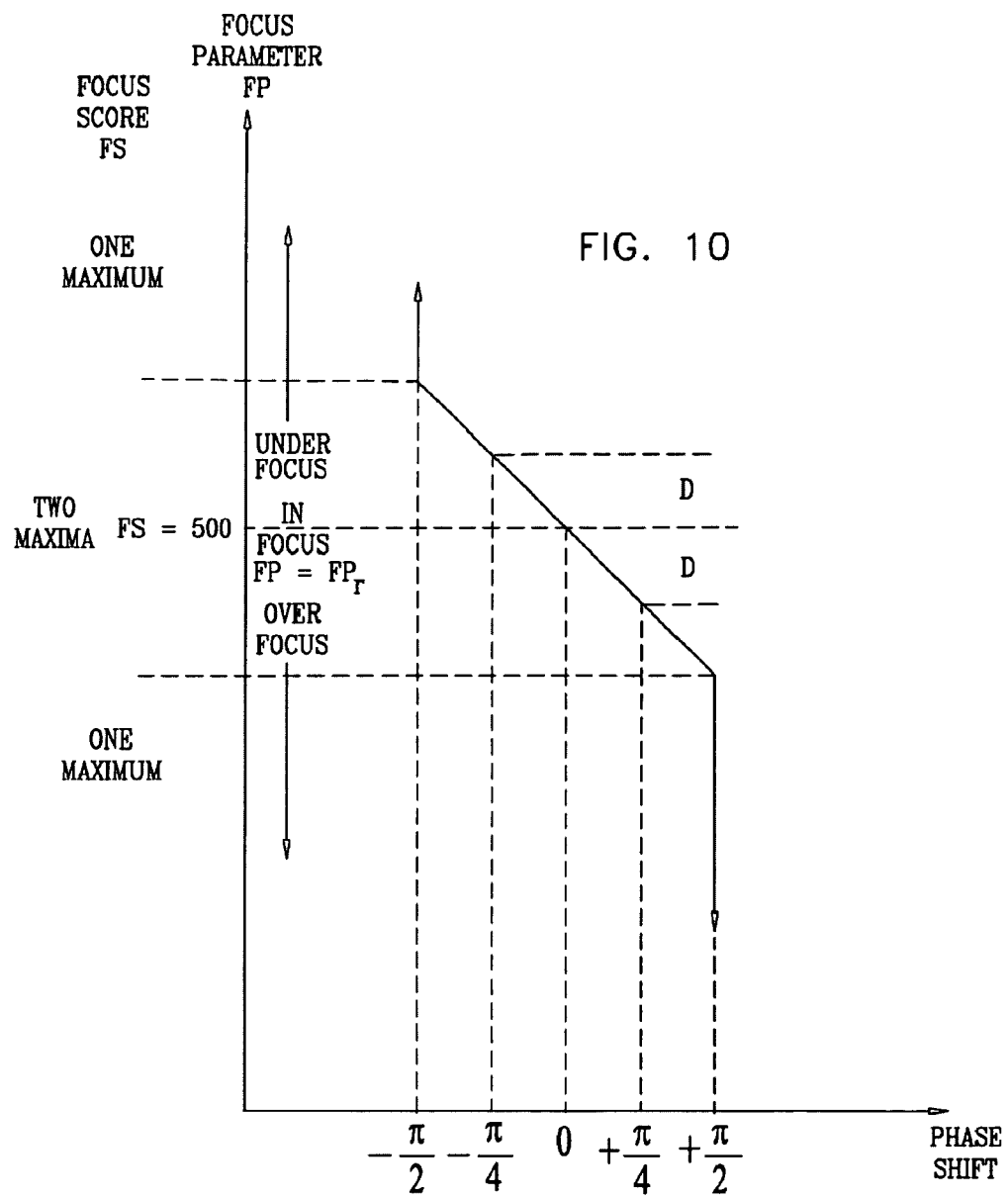
FIG. 10 and FIG. 11 summarize the results of the graphs of FIGS. 2-9, according to an embodiment of the present invention.
Figure 11:
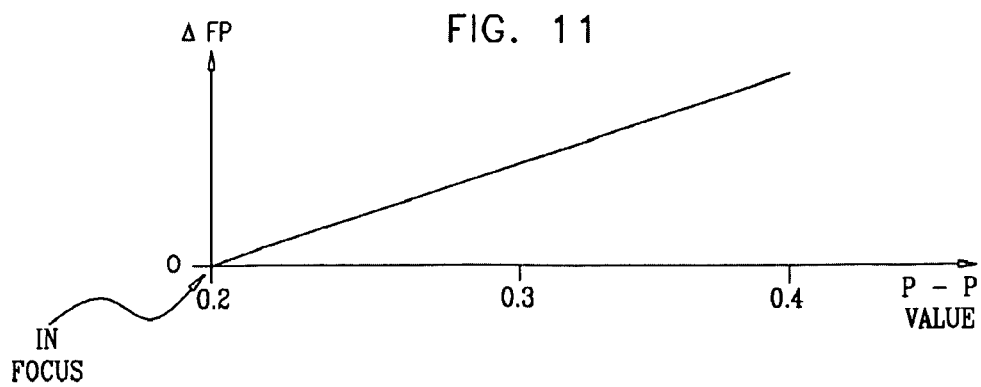

FIG. 10 and FIG. 11 summarize the results of the graphs of FIGS. 2-9, according to an embodiment of the present invention. FIG. 10 is a graph of focus state vs. phase shift, the phase shift, or phase difference, being the phase distance of a normalized focus score maximum from the 2π phase of the focus parameter. The focus state is measured in terms of focus score and focus parameter. The graph illustrates that at the in-focus state wherein FS=500 and FP=$FP_r$, and close to this state, there are two focus score maxima for each half-cycle of the focus parameter. In this region, the phase difference is a good metric for the amount that the system is out-of-focus, the phase difference varying monotonically about the in-focus, or exact focus, state. Thus the phase difference determines if the out-of-focus state is an under-focus state or an over-focus state, and gives a value for changing the focus parameter to return the system to an in-focus state. For example, as shown in the graph, if the phase difference is $$+\frac{\pi}{4},$$

increasing the focus parameter by ΔFP=D returns the system substantially to an in-focus state. Also as shown in the graph, if the phase difference is $$-\frac{\pi}{4},$$

decreasing the focus parameter by ΔFP=D returns the system substantially to an in-focus state.

The graph also illustrates that in the more out-of-focus states, wherein there is one maximum for each half-cycle of the focus parameter, the value of the phase difference indicates if the system is in-focus or out-of-focus. Thus, for a phase difference of $$+\frac{\pi}{2},$$

the focus parameter needs to increase to return the system to an in-focus state. For a phase difference of $$-\frac{\pi}{2},$$

the focus parameter needs to decrease to return the system to an in-focus state.

FIG. 11 is a graph of ΔFP vs. p-p separation of normalized focus scores, based on the normalized focus scores of FIGS. 4-8, wherein the reference focus score was assumed to be 500. It will be understood from FIG. 9 that generally similar graphs to FIG. 11 apply for other reference focus scores. The graph of FIG. 11 illustrates that the relationship between the two variables, ΔFP and p-p separation, is monotonic, and that the value of the p-p separation may be used to determine how far system 10 is from the in-focus state. The graph also illustrates that the p-p separation is a minimum at the in-focus state.

Figure 12:
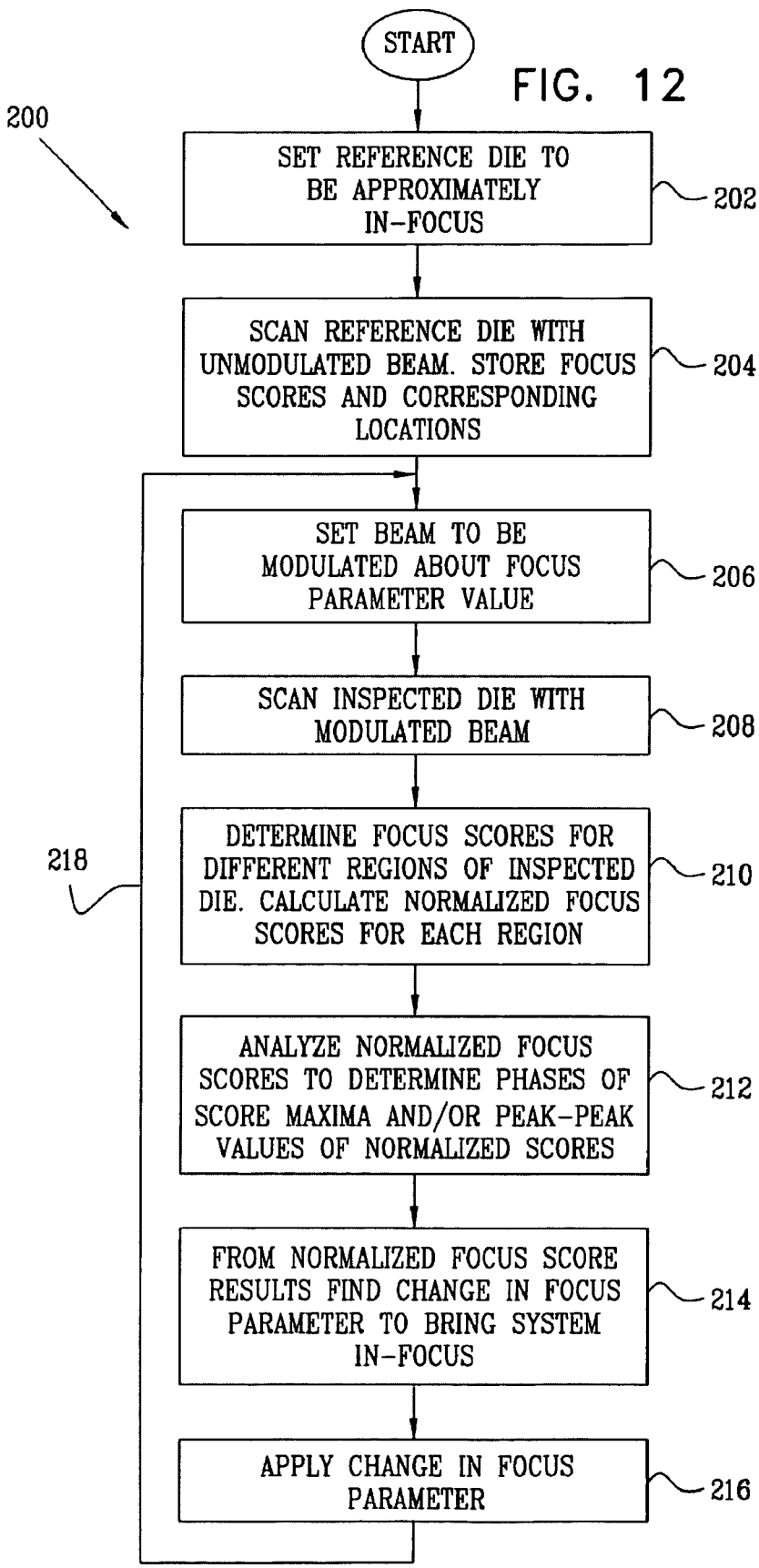
FIG. 12 is a flowchart of a process performed by a processor to focus the system of FIG. 1A, according to an embodiment of the present invention.

FIG. 12 is a flowchart of a process 200 performed by processor 32 to focus system 10, according to an embodiment of the present invention. The process is a two stage process, comprising a first stage wherein a reference die is scanned without using a feedback loop, and a second stage wherein inspected dies are scanned using a feedback loop. Process 200 uses properties of the focus scores described above with reference to the graphs of FIG. 10 and FIG. 11.

In a first step 202, system 10 is configured, typically by an operator of the system via user interface 40, so that reference die 49R on wafer 39 is approximately in-focus. The configuration includes, inner alia, setting the focus parameter FP of the electron beam, herein assumed to be $FP_r$.

In a second step 204, the processor scans the reference die with an unmodulated electron beam, i.e., with the beam having a substantially fixed focus parameter $FP_r$. The processor stores in memory 33 the measured focus scores and corresponding locations of sites of the reference die. The first stage of process 200 comprises the first and second steps, and completes when the second step has concluded.

In a third step 206, the processor modulates the focus parameter of the electron beam. By way of example, the modulation is assumed to be initially about the value $FP_r$. The processor may set the amplitude of modulation to be constant, or to vary. Hereinbelow, except where otherwise stated, the modulation amplitude is assumed to be substantially constant.

In a fourth step 208, processor 32 scans the remaining dies on wafer using the modulated beam. Substantially the same procedure is followed for each of the remaining dies, and the following description assumes that inspected die 49I is scanned.

In a fifth step 210, as die 49I is scanned, the processor determines the focus scores for different locations of the die. The processor calculates the normalized focus scores for a given location, by dividing the focus scores determined from the modulated beam by the focus score stored in memory 33 for the equivalent location in second step 204.

In a sixth step 212, the normalized focus scores are analyzed to determine phases of the maxima of the scores with respect to the modulation phase. Alternatively or additionally, the peak-peak value of the normalized scores is also determined.

In a seventh step 214, using the phases of the maxima of the normalized scores, and/or the size of the peak-peak value of the normalized scores, the processor determines a change in value of the focus parameter FP that still bring the given region into focus. The processor determines the change substantially according to the description given above with reference to FIG. 10 and FIG. 11. Consideration of FIG. 10 and FIG. 11 shows that either the phase difference, or the normalized peak-peak value, or both measurements, may be used to determine the change of focus parameter required to return the region to an in-focus state.

Thus, if only the phase difference is used, phase differences in the range greater than $$-\frac{\pi}{2}$$

and less than $$+\frac{\pi}{2}$$

generate a value by which FP needs to change to return the system to an in-focus state. A phase difference of $$+\frac{\pi}{2}$$

indicates that FP needs to increase; a phase difference of $$-\frac{\pi}{2}$$

indicates that FP needs to decrease. Typically, for the latter two cases (phase differences of $$+\frac{\pi}{2} \text{ or } -\frac{\pi}{2}),$$

processor 32 increases or decreases FP by a preset amount, so as to return the system to an in-focus state, or to an out-of-focus state wherein the phase difference is between $$-\frac{\pi}{2} \text{ and } +\frac{\pi}{2}.$$

If the peak-peak value as well as the phase difference is used, the value of the peak-peak value at phase differences of $$-\frac{\pi}{2} \text{ or } +\frac{\pi}{2}$$

may provide a measure of how large an increase in FP, or a decrease in FP, processor 32 needs to apply to return the system to an in-focus state.

If only the peak-peak value is used, processor 32 may determine if FP is to increase or decrease by changing the value of FP in a given direction, and measuring if the change decreases the peak-peak value. The amount of change of FP may be determined using a graph similar to graph FIG. 11.

In a final feedback step 216, the processor applies the focus parameter value change determined in step 214 to the focus parameter mean value set in step 206, as indicated by a line 218 in the flowchart, which illustrates the feedback loop of process 200. Typically, processor 32 applies a smoothing filter and/or a time constant to the focus parameter value change to optimize focusing of system 10. Values for the smoothing filter and the time constant may be determined by the operator without undue experimentation.

As stated above, processor 32 may vary the modulation amplitude of the focus parameter. Inspection of the graphs of FIG. 2 and FIG. 3B illustrates that the processor may reduce the amplitude of modulation when system 10 is approximately in-focus, compared to the amplitude of modulation when the system is more out-of-focus, without affecting results of process 200. Such a variation may typically be applied in final step 216, so that the amplitude of modulation is minimized when system 10 is approximately in-focus, and is increased if the system is out-of-focus. If processor 32 varies the amplitude of modulation, any changes are typically applied in feedback step 216, and the processor smoothes any changes in modulation generally as described above for the focus parameter value change.

Figure 13:
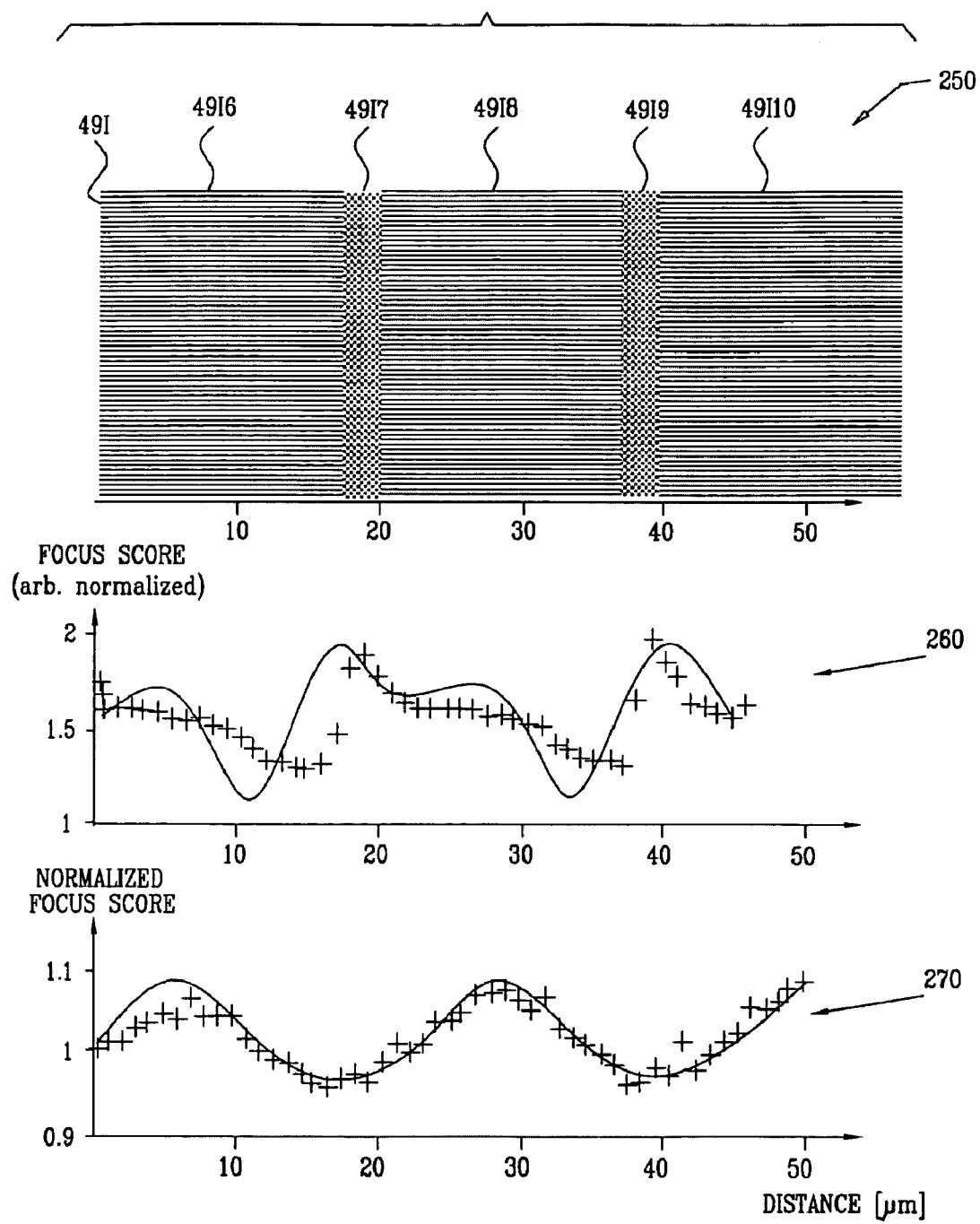
FIG. 13 illustrates results of the process of FIG. 12, according to an embodiment of the present invention.

FIG. 13 illustrates results of process 200, according to an embodiment of the present invention. A diagram 250 schematically illustrates sections of die 49I, comprising sites 49I6, 49I8, 49I10 having a first pattern and sites 49I7, 49I9 having a second, different, pattern. Different patterns typically have different effective spatial variations, and may include substantially the same variation at a different angle. However, a difference in pattern may be substantially any difference, such as a change of constituents, that causes a change in focal scores for the particle beam.

A graph 260 shows values of focus scores, arbitrarily normalized, for system 10 when process 200 is not implemented. The graph plots focus scores as unsmoothed points, and as a smoothed line. As is seen from the graph, the change of patterns between sites markedly affects the values of the focus scores.

A graph 270 shows values of normalized focus scores for system 10 when process 200 is implemented, showing both unsmoothed points and a smoothed line. As is seen from the graphs, the change of patterns between sites has substantially no effect on the normalized focus scores. Thus, process 200 maintains system 10 in-focus, substantially independently of the pattern on surface 39.

The description above illustrates how periodic modulation of a focus parameter generates modulation of normalized focus scores. Furthermore, an exact focus for the primary, beam may be determined by comparing phases of the focus parameter modulation with the modulated normalized focus scores. Alternatively or additionally, the exact focus may be determined from a peak-peak measurement of the normalized focus scores. It will be appreciated that the methods described hereinabove for comparing the phases are by way of example, and any other suitable comparison of phases, such as measuring phase differences between differentials of the focus parameter and the normalized scores may be used. Similarly, the methods described above for measuring size of the variation of the normalized focus scores are by way of example, and another convenient measure of the variation, such as an amplitude or a root mean square value of the normalized scores, may be used.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

I claim:

1. A method for focusing a scanning microscope, comprising;

scanning a primary charged particle beam across a plurality of first sites of a reference die of a wafer;

detecting a secondary beam of charged particles emitted from the plurality of first sites in response to the primary charged particle beam;

computing first focus scores for the plurality of first sites based on the detected secondary beam;

scanning the primary charged particle beam across a plurality of second sites of a given die of the wafer while modulating a focal depth of the primary charged particle beam, the reference die and the given die having congruent layouts, and wherein the second sites respectively correspond vectorially in location with the first sites of the reference die;

detecting the secondary beam of charged particles emitted from the plurality of second sites in response to the primary charged particle beam;

computing second focus scores for the second sites based on the detected secondary beam emitted therefrom, and determining an exact focus of the primary charged particle beam for the second sites in response to the first and the second focus scores.

2. The method according to claim 1, wherein modulating the focal depth comprises modulating a focal parameter of a focusing element of the microscope, wherein computing the second focus scores comprises determining a phase of the second focus scores, and wherein determining the exact focus comprises comparing the phase of the second focus scores with a phase of the focal parameter.

3. The method according to claim 2, wherein comparing the phase of the second focus scores with the phase of the focal parameter comprises determining a difference between the phase of the second focus scores and the phase of the focal parameter, and wherein the difference varies monotonically about a reference phase corresponding with the exact focus.

4. The method according to claim 1, wherein computing the second focus scores comprises determining an amplitude variation of the second focus scores, and wherein determining the exact focus comprises determining the exact focus in response to the amplitude variation.

5. The method according to claim 4, wherein the amplitude variation is a minimum at the exact focus, and wherein determining the exact focus comprises determining a difference of a measured amplitude variation from the minimum.

6. The method according to claim 1, wherein modulating the focal depth comprises modulating a focal parameter of a focusing element of the microscope, and wherein determining the exact focus comprises setting the focal parameter in response the first and second focus scores.

7. The method according to claim 1, wherein the plurality of first sites and the plurality of second sites comprise sites having differing patterns, and wherein determining the exact focus comprises determining the exact focus for the sites having differing patterns.

8. The method according to claim 1, wherein determining the exact focus comprises comparing respective first focus scores with respective second focus scores so as to form respective normalized focus scores.

9. The method according to claim 1, wherein scanning the primary charged particle beam across the plurality of first sites comprises maintaining a focal parameter of the primary charged beam at a constant value.

10. Apparatus for focusing a scanning microscope, comprising:
- an irradiation module which is configured to scan a primary charged particle beam across a plurality of first sites of a reference die of a wafer, and to scan the primary charged particle beam across a plurality of second sites of a given die of the wafer while modulating a focal depth of the primary charged particle beam, the reference die and the given die having congruent layouts, and wherein the second sites respectively correspond vectorially in location with the first sites of the reference die;
- an imaging detector which is configured to detect a secondary beam of charged particles emitted from the first sites and the second sites in response to the primary charged particle beam; and
- a processor which is configured to compute first focus scores for the plurality of first sites and second focus scores for the plurality of second sites based on the detected secondary beam and to determine an exact focus of the primary charged particle beam for the second sites in response to the first and the second focus scores.

11. The apparatus according to claim 10, wherein modulating the focal depth comprises modulating a focal parameter of a focusing element of the microscope, wherein computing the second focus scores comprises determining a phase of the second focus scores, and wherein determining the exact focus comprises comparing the phase of the second focus scores with a phase of the focal parameter.

12. The apparatus according to claim 11, wherein comparing the phase of the second focus scores with the phase of the focal parameter comprises determining a difference between the phase of the second focus scores and the phase of the focal parameter, and wherein the difference varies monotonically about a reference phase corresponding with the exact focus.

13. The apparatus according to claim 10, wherein computing the second focus scores comprises determining an amplitude variation of the second focus scores, and wherein determining the exact focus comprises determining the exact focus in response to the amplitude variation.

14. The apparatus according to claim 13, wherein the amplitude variation is a minimum at the exact focus, and wherein determining the exact focus comprises determining a difference of a measured amplitude variation from the minimum.

15. The apparatus according to claim 10, wherein modulating the focal depth comprises modulating a focal parameter of a focusing element of the microscope, and wherein determining the exact focus comprises setting the focal parameter in response to the first and second focus scores.

16. The apparatus according to claim 10, wherein the plurality of first sites and the plurality of second sites comprise sites having differing patterns, and wherein determining the exact focus comprises determining the exact focus for the sites having differing patterns.

17. The apparatus according to claim 10, wherein determining the exact focus comprises comparing respective first focus scores with respective second focus scores so as to form respective normalized focus scores.

18. The apparatus according to claim 10, wherein scanning the primary charged particle beam across the plurality of first sites comprises maintaining a focal parameter of the primary charged beam at a constant value.

* * * * *